United States Patent
Naujokat

(10) Patent No.: US 7,653,758 B2
(45) Date of Patent: Jan. 26, 2010

(54) MEMORY SYSTEM WITH MEMORY CONTROLLER AND BOARD COMPRISING A DIGITAL BUFFER WHEREIN INPUT/OUTPUT DATA AND CLOCK SIGNALS ARE APPLIED IN PARALLEL

(75) Inventor: Joern Naujokat, Freising (DE)

(73) Assignee: Texas Instruments Deutschalnd GmbH, Freising (DE)

( * ) Notice: Subject to any disclaimer, the term of this patent is extended or adjusted under 35 U.S.C. 154(b) by 279 days.

(21) Appl. No.: 11/875,516

(22) Filed: Oct. 19, 2007

(65) Prior Publication Data

US 2008/0098251 A1 Apr. 24, 2008

Related U.S. Application Data

(60) Provisional application No. 60/882,464, filed on Dec. 28, 2006.

(30) Foreign Application Priority Data

Oct. 19, 2006 (DE) ........................ 10 2006 049 310

(51) Int. Cl.
G06F 1/12 (2006.01)
G06F 12/02 (2006.01)

(52) U.S. Cl. ............................... 710/3; 710/52; 710/58; 711/110; 713/400; 713/401; 713/500

(58) Field of Classification Search ............... 710/3, 710/58, 52; 713/400, 401, 500; 711/110
See application file for complete search history.

(56) References Cited

U.S. PATENT DOCUMENTS

| 6,710,726 | B2 * | 3/2004 | Kim et al. ............... 341/100 |
| 6,754,112 | B2 * | 6/2004 | Ahn et al. ................ 365/194 |
| 6,810,486 | B2 * | 10/2004 | Fayneh et al. ............ 713/503 |
| 7,095,661 | B2 | 8/2006 | Osaka et al. |
| 7,187,738 | B2 * | 3/2007 | Naven et al. ............. 375/355 |
| 2003/0031060 | A1 | 2/2003 | Nishio et al. |
| 2006/0182212 | A1 * | 8/2006 | Hwang et al. ............. 375/354 |

OTHER PUBLICATIONS

"PC2100 and PC1600 DDR SDRAM Registered DIMM: Design Specification," Jedec Standard No. 21-C, Release 11b, Revision 1.3, Jan. 2002, pp. 4.20.4-1, 4.20.4-10, 4.20.4-17, abd 4.20.4-38 thru 4.20.4-43 and 4.20.4-46.

* cited by examiner

*Primary Examiner*—Tammara Peyton
(74) *Attorney, Agent, or Firm*—John J. Patti; Wade J. Brady, III; Frederick J. Telecky, Jr.

(57) ABSTRACT

A digital registered data buffer is disclosed that has data paths each with a data input for receiving a digital data input signal (Dn), a clock input for receiving a clock input signal (CLK) and a data output providing a digital data output signal (Qn) for application to a data destination device such as memory devices. The buffer further has a clock output for providing an output clock signal (QCLK) to the data destination device and a phase-locked loop (PLL) with a clock input, a feedback input, a feedback output and a plurality of clock outputs. The buffer uses a pair of data registers, i.e. flip-flops (FF1, FF2) connected in series in each data path. The first data register in each data path is clocked by the clock input signal (CLK) and the second data register in each data path is clocked by one of the clock outputs (PDCLK) from the PLL.

14 Claims, 4 Drawing Sheets

MEMORY SYSTEM WITH MEMORY CONTROLLER AND BOARD COMPRISING A DIGITAL BUFFER WHEREIN INPUT/OUTPUT DATA AND CLOCK SIGNALS ARE APPLIED IN PARALLEL

This application claims priority from German Patent Application No. 10 2006 049 310.9 filed 19 Oct. 2006 and from U.S. Provisional Patent Application No. 60/882,464 filed 28 Dec. 2006.

FIELD OF THE INVENTION

The invention relates to a digital data buffer for use with a device that requires a digital data input with an associated clock signal.

BACKGROUND

The invention relates to a digital data buffer having a data path or a plurality of parallel data paths, each with a data input for receiving a digital data input signal, a clock input for receiving a clock input signal, and a data output providing a digital data output signal for application to a data destination device. The buffer is suitable for use with a data destination device that may be any device that requires a digital data input with an associated clock signal.

There is a need to have such a digital data buffer that is optimized in the setup/hold timing relationship and substantially free from phase jitter. There is a need for use of such a device in a memory system operating at clock frequencies as high as 800 MHz and above. Currently, a data buffer for this kind of application is not available.

SUMMARY

The invention provides a data buffer that addresses the above described needs.

In a described embodiment, a data buffer is provided that has at least one data path with a data input for receiving a digital data input signal (Dn), a clock input for receiving a clock input signal (CLK) and a data output providing a digital data output signal (Qn) for application to a data destination device. The buffer further has a clock output for providing an output clock signal (QCLK) to the data destination device and a phase-locked loop (PLL) with a clock input, a feedback input, a feedback output and a plurality of clock outputs. For the given example, the data path has a first data register (FF1) with a data input, a clock input and a data output, and a second data register (FF2) with a data input, a clock input and a data output. The data input of the buffer is connected to the data input of the first data register (FF1). The data output of the first data register (FF1) is connected to the data input of the second data register (FF2). The data output of the buffer is connected to the data output of the second data register (FF2). The clock input of the buffer is connected to the clock input of the first data register (FF1), and to the clock input of the phase-locked loop (PLL). A first clock output of the phase-locked loop (PLL) provides a feedback clock signal (PFBCLK) for application to the feedback input of the phase-locked loop (PLL). A second clock output of the phase-locked loop provides a clock signal (PDCLK) shifted in phase by a fraction (X) of the clock period with respect to the feedback clock signal (PFBCLK) for application to the clock input of the second data register (FF2). A third clock output of the phase-locked loop provides a clock signal (PQCLK) shifted in phase by an amount of 180° plus a fraction (X; Z) of the clock period with respect to the feedback clock signal (PFBCLK) for application to the clock input of the data destination device.

Other details of example embodiments are given below.

BRIEF DESCRIPTION OF THE DRAWINGS

The new architecture and the benefits of the inventive digital data buffer will be apparent from the following detailed description of example embodiments, with reference to the appending drawings, wherein.

DETAILED DESCRIPTION OF EXAMPLE EMBODIMENTS

Figure 1:
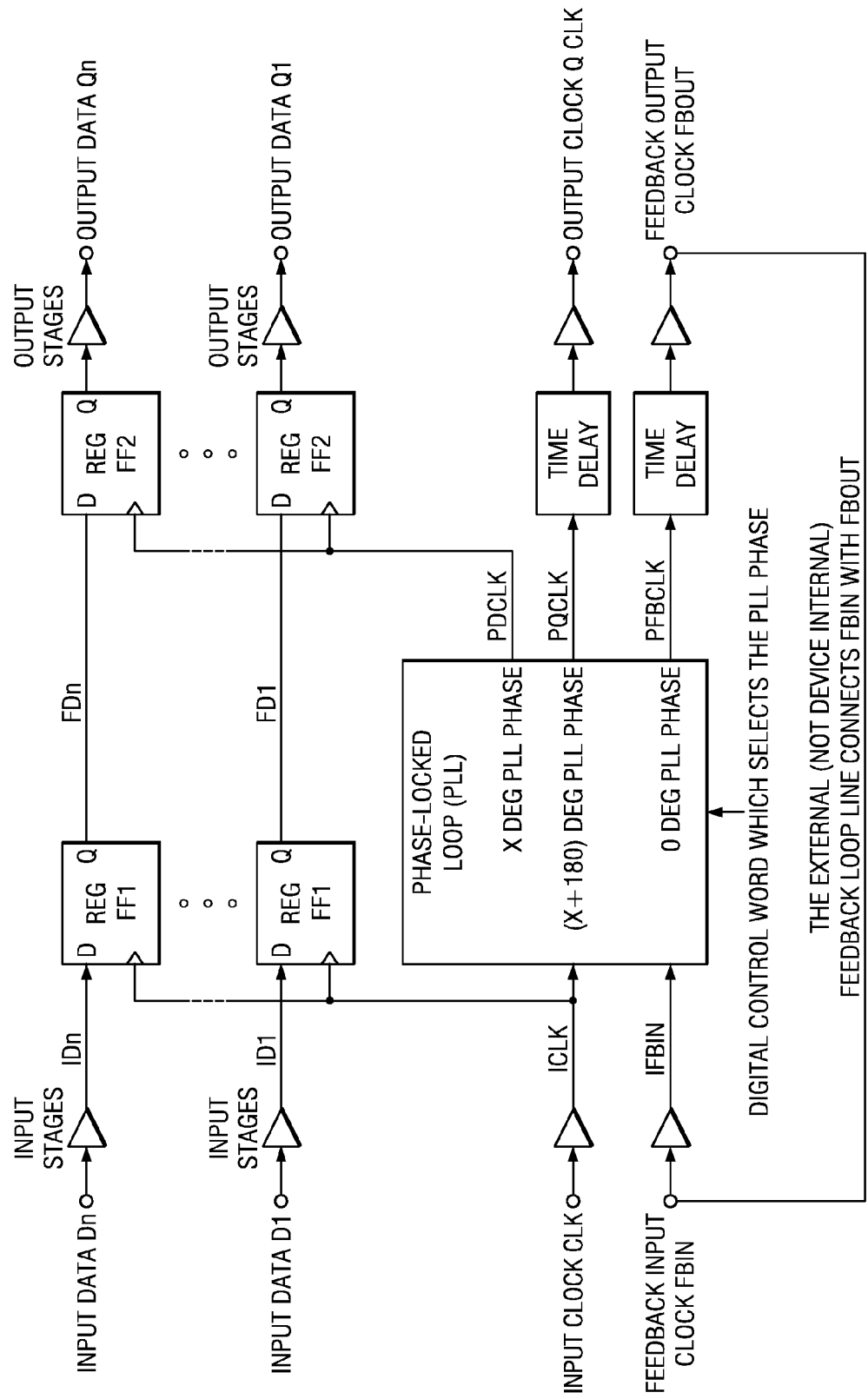
FIG. 1 is a schematic block diagram of a registered digital data buffer according to a first embodiment.

With reference to FIG. 1, a digital data buffer is shown with a number n of parallel 1-bit data paths. Each data path comprises a data input stage, a first data register formed by a flip-flop FF1, a second data register formed by a flip-flop FF2, and a data output stage. Input data signals D1 to Dn are applied to the respective input stages, and the outputs ID1 to IDn of the input stages are applied to the D-input of the respective first data registers FF1. The outputs FD1 to FDn of the first data registers FF1 are applied to the D-inputs of the respective second data registers FF2, and the outputs of the second data registers FF2 provide the external output data Q1 to Qn through a respective output stage.

In a preferred embodiment, the data input stages convert a differential input to a single-ended output, and the data output stages convert a single-ended input to a differential output.

The first data registers FF1 are each clocked in parallel by an internal input clock signal ICLK obtained from an external input clock signal CLK by means of a clock input stage. The second data registers FF2 are each clocked in parallel by an internal output clock signal PDCLK provided by a phase-locked loop circuit PLL. The phase-locked loop circuit PLL has a signal input to which the internal clock input signal ICLK is applied. The phase-locked loop circuit PLL further has an internal feedback output that provides an internal feedback output signal PFBCLK and an internal feedback input that receives an internal feedback input signal IFBIN. The internal feedback output signal PFBCLK is fed back to the internal feedback input through a time delay element, an output stage, an external feedback line that provides an external feedback input signal FBIN and a feedback input stage. In this context, "internal" means on-chip with respect to circuitry implemented as an integrated circuit, and "external" means outside of the integrated circuit, such as on a board. Other configurations are possible.

In the basic embodiment, the phase-locked loop PLL provides the internal clock output signal PDCLK at a phase shift X deg. with respect to the internal feedback output signal PFBCLK. The amount of the phase shift X deg. is a fraction of the period of the input clock signal CLK and can be negative, positive or zero, as will be discussed. In this basic embodiment, the phase-locked loop PLL further provides an internal clock output signal PQCLK shifted in phase by 180 deg. with respect to the clock output signal PDCLK and applied to a time delay element followed by a clock output stage, which provides an external output clock signal QCLK. The amount of the phase shift X deg. is adjusted by applying a digital control word to the PLL.

Figure 2:
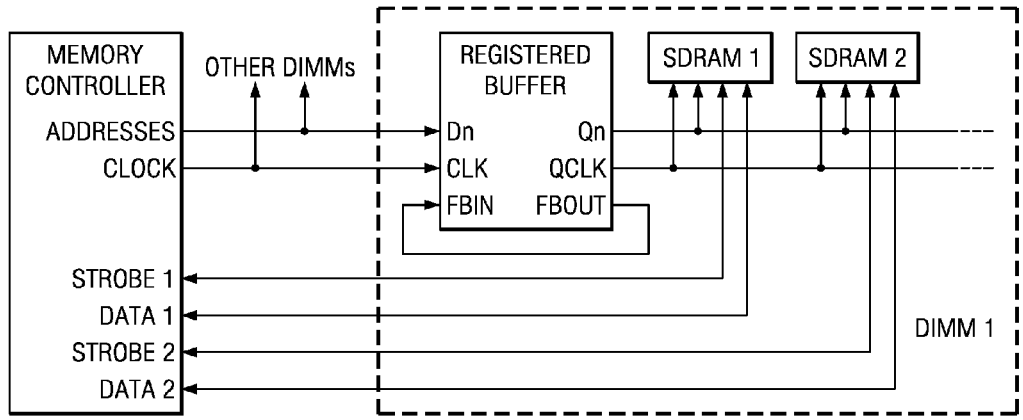
FIG. 2 is a schematic block diagram of a memory system in which the data buffer can be used.

The external output data Q1 to Qn are intended to be supplied to a destination device along with the external output clock signal QCLK. By way of a preferred example application, FIG. 2 shows a RAM memory system with a memory controller and a DIMM module which incorporates one of the inventive data buffers, referred to as "Registered Buffer," and a plurality of similar memory devices SDRAM1, SDRAM2, etc., with the option of adding further similar DIMM modules to the memory system. Although only one data path with input signal Dn and output signal Qn is shown, it should be clear that the signals would be n bits wide.

Figure 3:
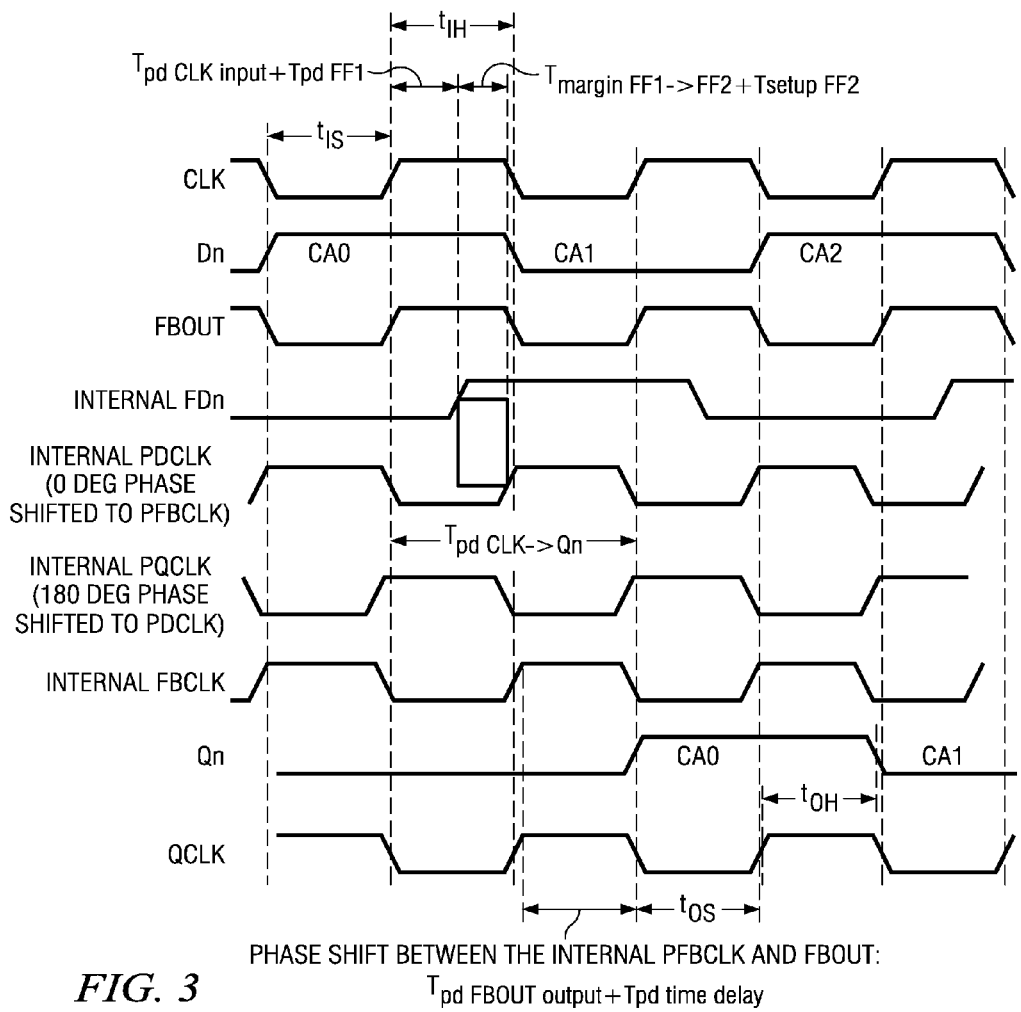
FIG. 3 is a signal diagram illustrating the operation of the data buffer in a first scenario.
Figure 4:
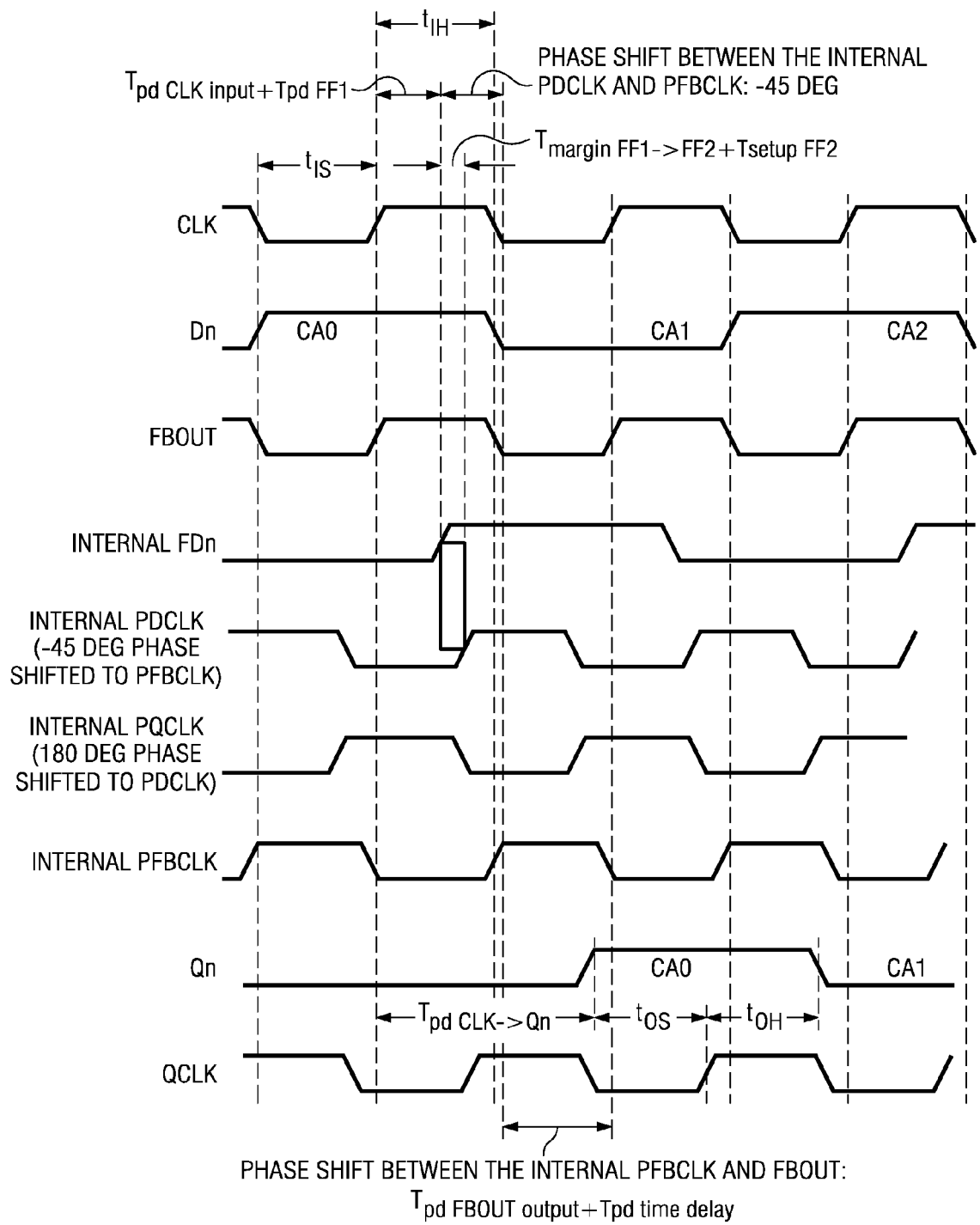
FIG. 4 is a signal diagram illustrating the operation of the data buffer in a second scenario.

Benefits of the described data buffer are explained in further detail with reference to FIGS. 3 and 4, the first of which refers to a scenario with X=0 deg. and the second with X=−45 deg. For clarity, only one polarity of the differential signals is shown in these figures.

As will be seen, one aspect of the invention is to provide a circuit comprising a registered buffer with a PLL clock driver having a temperature stable, very low phase variation between output clock and input clock. The circuitry comprises input stages, output stages, data registers (flip-flops), a phase-locked loop (PLL), time delay circuits to match the propagation delay of the register flip-flop FF2, and an external feedback loop for the PLL feedback signal. The PLL gets the input clock CLK as a reference clock and the FBIN clock as a PLL feedback clock. It provides three different output signals PDCLK, PQCLK and PFBCLK having the same output frequency but different phases relative to each other.

The frequency of the PLL output clock signals PDCLK, PQCLK and PFBCLK is the same as the frequency of the input clock signal CLK. The PDCLK signal has a phase relation/shift of X deg. relative to the PFBCLK signal, and the PQCLK signal has a phase relation/shift of (X−180) deg. relative to the PFBCLK signal. Here, the degree value is taken with reference to the output clock period, with 360 deg. meaning one entire clock period $T_{clk}$ of a clock with frequency of $F_{clk}$.

The value X as a value for the phase shift can be selected by applying a digital control word/signal to the PLL block. This digital control word can come from the device internal control logic or from outside the device. While the input clock signal is always toggling with a fixed known frequency $F_{clk}$, the input data signal Dn can be seen as a "random" pattern of high and low pulses which represent logical ones and zeros. If the input data signal Dn always toggles from high to low and back, then the maximum toggle rate/frequency $F_{data}$ is half that of the input clock frequency $F_{clk}$, or, in other words, the minimum input data period $T_{data}$ is twice the input clock period $T_{clk}$.

In general, the primary purpose of a registered buffer with PLL clock driver is to buffer the incoming data first and to then provide the data out signal with a "refreshed" waveform. Without this registered buffer, the waveforms of the data signals would degrade too much because of the heavier line loads. The PLL clock driver has the function to "refresh" the associated clock signal, too. The clock signal is cleaned up with respect to its clock jitter.

The new topology of a registered buffer device with a PLL clock driver has the following described functions/benefits:

1.) The data buffer is able to handle a minimum setup/hold timing relation between the input clock CLK and the input data Qn at the input register flip-flops FF1. This is achieved by having a double buffer structure (two register flip-flops in series) instead of a single buffer structure (only one register flip-flop for a data path). This makes it possible to store the incoming data Dn (usually more than one bit) with the input clock CLK and not with the PLL output clocks into the input register flip-flop FF1. If a single buffer structure were used, then the "jitter-cleaned" PLL output clock and not the input clock would have to be used for triggering the flip-flops in order to get a "refreshed" optimum timing relationship between QCLK and Qn at the outputs. If the input clock in a single buffer structure were used for triggering, then the input clock jitter would be seen also as jitter of the Qn signal. This noisy Qn signal in combination with the jitter-cleaned QCLK signal would lead to a jittering QCLK to Qn timing relationship and would degrade the setup/hold timing margin at the subsequent receiving device. A disadvantage of the single buffer structure is that the usage of the PLL output clock for triggering the flip-flops degrades the setup/hold timing margin at the inputs of the register flip-flops. The reason for the setup/hold timing margin degradation is that the PLL output clock has a different absolute phase and a different phase variation behavior (no clock jitter) compared to the input clock signal CLK and that the input data Dn are transmitted to the register inputs with reference to the input clock CLK and not the PLL output clock. The advantage of the double buffer structure is that a registered buffer can be built which can handle a minimum setup/hold timing margin between Dn and CLK at the register input side and provides a maximum setup/hold timing margin between Qn and QCLK for the subsequent data receiving device (in particular the memory system of FIG. 2) at the register output side.

2.) A jitter cleaned output clock signal QCLK is generated by using a PLL (phase-locked loop). The PLL gets as a reference clock the input clock signal CLK which is distorted with noise resulting in clock jitter. The PLL cleans the input clock signal CLK of its clock jitter and provides a "refreshed" output clock signal QCLK.

3.) The data buffer outputs the "refreshed" buffered data signals with reference the "refreshed" output clock. This is achieved by having the double buffer structure (two register flip-flops in series) wherein the second/output register flip-flop FF2 is triggered by the jitter-cleaned PLL output clock signal. An advantage of having a "refreshed" output data signal Qn and a "refreshed" output clock signal QCLK is that the phase relationship between the two signals is also "refreshed" to its originally desired value. The "refreshed" phase relationship between Qn and QCLK is a sufficient large setup/hold timing margin of the Qn to the QCLK signal. This large setup/hold timing margin is important for the following receiving device.

4.) The data buffer ensures a maximum setup/hold timing margin between the output data signal Qn and the output clock signal QCLK for the input flip-flops/input registers of the subsequent receiving device. The setup/hold timing margin for the subsequent device between Qn and QCLK will have its maximum value if both the rising and falling clock edges of QCLK are always in the middle of an output data Qn bit. An output data bit will have a time duration of the clock period $T_{clk}$. The desired phase relationship between QN and QCLK is achieved in such a way that the QCLK signal is generated from the PLL output signal PQCLK which is 180 deg. phase shifted compared to the PLL output signal PDCLK which triggers the output data register flip-flop FF2. A 180 deg. phase shift means that the rising edge of the PQCLK signal comes half of a clock period $T_{clk}$ later than the rising edge of the PDCLK signal.

5.) This device provides a temperature stable, very low phase variation between the output clock QCLK and the input clock CLK. This temperature stable, very low phase variation between the output clock and the input clock is an important feature/specification parameter of this device. Especially if this buffer device is used in a memory system, this temperature stable, very low phase variation is necessary to ensure a stable system clock which is generated by a memory controller, propagates through the buffer device and later through the SDRAM and then, after several clock cycles, comes back to the memory controller to latch data in or out.

This temperature stability is mainly achieved by having a PLL, having an external feedback loop, having an input feedback clock stage/path which matches the CLK input stage, and having an output feedback clock stage/path which matches the QCLK output stage/path. The PLL controls the timing in such a way that the phase offset between the internal reference clock ICLK and internal feedback clock IFBIN will be nearly zero under all conditions. If the input clock stages/input clock paths for CLK and FBIN are the same/matching, then the propagation delays of both stages/paths will be the same. In addition, the two propagation delays will behave in the same way over temperature changes. If the propagation delay of the CLK input stage/path increases due to a temperature change, then the propagation delay of the FBIN input stage/path will increase by the same amount. Due to this input stage/path matching, the nearly zero phase offset between ICLK and IFBIN can be seen directly as a nearly zero phase offset between CLK and FBIN. If the clock output stages for QCLK and FBOUT are the same/matching, then the propagation delays of both stages will also be the same. Furthermore, the time delay circuits in the QCLK and FBOUT output paths are also the same and are matching regarding the propagation delays. Therefore, the two propagation delays of the two output paths (time delay circuit+output stage) will behave in the same way over temperature changes. If the propagation delay of the QCLK output path increases due to a temperature change, then the propagation delay of the FBOUT output path will increase by the same amount. In order to get a good match between the two output paths, the two output stages should see/have nearly the same load, so that the output stages are driving the output lines in the same way. Due to this output path matching, the phase difference between the two different PLL output signals PQCLK and PFBCLK [(X+180) deg. and 0 deg.] can be seen directly as a phase offset between QCLK and FBOUT.

The phase relationship between FBIN and FBOUT is determined by the propagation delay through the external feedback loop line in combination with or without a possible load.

In the preferred application, it will normally be desired to make the propagation delay from FBOUT to FBIN as low as possible in order to get a low entire propagation delay between CLK and QCLK and also to get a low entire propagation delay between CLK and Qn. The reason for using a device external feedback loop and not a device internal feedback loop is that an external loop requires FBIN input stage and FBOUT output stages which match better to the CLK input and FBOUT output stages.

Having only an internal loop, there would be no need for an input and output stage in the entire feedback path. But then it would not be possible to compensate for the variation of the propagation delay of the CLK input stage and of the QCLK output stage which are caused by temperature changes. Even if the FBIN input and the FBOUT output stages were built into the PLL feedback path, an internal loop would still have the disadvantages of being a capacitive load which is much different from/smaller than the capacitive load of the QCLK output. An external feedback loop provides a better matching here between the FBOUT load and the QCLK load and therefore leads to a better matching of the propagation delays. Based on the considerations described above, the entire propagation delay can be calculated to be the sum of the phase relation between CLK and FEIN, the phase relation between FBIN and FBOUT and the phase relation between FBOUT and QCLK.

The overall timing of interest QCLK to CLK is the ICLK/IFBIN PLL phase offset plus the feedback loop line delay plus the phase shift between the two used PLL output signals PQCLK and PFBCLK. If a short feedback loop line is used, so that the propagation delay of the line can be neglected, and if the phase offset between CLK and FBIN is small enough, then the relationship between the QCLK and CLK is roughly:

$$\{(X+180) \text{ deg.}/360 \text{ deg.}\} * \text{clock period } T_{clk},$$

Accordingly, the phase relationship between QCLK and CLK is determined by only the selected output phases of the phase-locked loop and not by other components.

As the phase difference between the two PLL output signals PQCLK and PFBCLK is stable over temperature, the entire phase relation between the output clock signal QCLK and the input clock signal CLK is also temperature stable and the phase variation is very low.

In summary, a temperature stable, very low phase variation between QCLK and CLK is achieved by using a PLL with an external feedback loop line and by matching the CLK/FBIN input paths and by matching the QCLK/FBOUT output paths.

6.) The device provides not only a maximum post register setup/hold timing margin between the output data signal Qn and the output clock signal QCLK for the input flip-flops/input registers of the following receiving device but also a setup/hold timing margin which is temperature stable. This temperature stable relation between Qn and QCLK is achieved by matching the output paths for QCLK with the output paths for Qn. As described above, a matching between the QCLK and FBOUT output paths is necessary to achieve a temperature stable, very low phase variation between QCLK and CLK. Now, this matching requirement is also valid for the Qn output paths. Here, output paths mean the circuitry after the PLL. In order to get the same propagation delay of all output paths, the output paths not having a second register flip-flop FF2 will have a time delay circuit included. Matching means that all output paths have the same propagation delay. In addition, all output stages should have similar loads. Then, the propagation delays of all output paths will behave similar if the temperature changes and therefore the output signal phases will have a stable, fixed relationship to each other over temperature changes.

7.) The device makes it possible to reduce the propagation delay for the data from the input to the outputs to a minimum time.

This propagation delay is the propagation time for one dedicated data bit from the input to the output. It is measured as a propagation time for one certain data bit as time from the rising edge of the input clock CLK which stores the certain data bit DB0 in the register flip-flop FF1 to the rising or falling edge of the output data signal Qn when the dedicated data bit DB0 is given out.

This propagation delay reduction to its minimum for a given known clock frequency is done by selecting a certain PLL phase shift X deg. value. If X was set to zero, then the PDCLK and PFBCLK clock signals would be in phase. In this case, the propagation delay would be nearly around one clock period $T_{clk}$. The propagation delay, if called Tpd CLK->Qn, is calculated the following way:

If the phase offset between the CLK and FBIN and the propagation delay through the external feedback loop line can be neglected, then the input clock signal CLK, the input feedback clock signal FBIN and the output feedback clock signal FBOUT can be considered to be in phase. As the PLL phase shift is chosen to be zero and as the output paths for the output data signal Qn and for the output feedback signal FBOUT have nearly the same propagation delay, then the rising and falling edges of the output data signal Qn are also in phase with the input clock signal CLK. This means that the CLK, FBIN, FBOUT and Qn signals can be considered to be in phase.

Now, we consider the pure propagation delays through the different blocks and stages. We assume here that the sum of the propagation delays of the clock input stage, of the register FF1, of the register FF2 and of the data output stage is less than one clock period $T_{clk}$. In the ideal case (neglecting the clocking scheme and looking only to the pure propagation delays), the lowest possible Tpd CLK->Qn is the sum of the propagation delays of the clock input stage, of the register FF1, of the register FF2 and of the data output stage. Here we neglect the internal setup/hold timing constraints of FF2. In this ideal case, the Tpd CLK->Qn would be less than one clock period $T_{clk}$, if the sum of the relevant stages/blocks is less the $T_{clk}$. For the real case, we have to consider the clocking scheme too. This means that we have to consider the fact that the entire Tpd is also determined by the triggering time of FF2.

Then, for the case X=0 deg., it takes exactly one clock period $T_{clk}$ for one certain data bit DB0 to propagate through the device from the belonging rising edge of the input clock signal CLK which stores the data bit into FF1 to the rising or falling edge of the output data signal Qn which gives the data bit out.

It is clear that this Tpd can only be one clock period, if the sum of the different propagation delays is smaller than one clock cycle. If, for example, this sum were between one and two clock cycles, then the entire Tpd CLK->Qn would be two clock periods. Having a Tpd CLK->Qn of one clock period $T_{clk}$ means that the absolute Tpd is higher for lower clock frequencies/larger clock periods and it is lower for higher clock frequencies/smaller clock periods. This dependency means also that the absolute Tpd CLK->Qn is much higher for lower clock frequencies/larger clock periods than it could be This propagation delay Tpd CLK->Qn can be reduced be selecting a negative phase shift between PDCLK and PFBCLK. Negative phase shift between PDCLK and PFBCLK means that a rising edge of the PDCLK clock signal comes earlier than a rising edge of the PFBCLK clock signal. If a negative X deg. phase is chosen, then the entire propagation delay Tpd CLK->Qn can be calculated as:

$$TpdCLK\text{->}Qn=(1-(|X|/360))*T_{clk} \text{ for } X \text{ between } 0 \text{ and } -360 \text{ and } |X| \text{ between } 0 \text{ and } 360.$$

As discussed above, the Tpd CLK->Qn can ideally be reduced to its minimum limit which is determined by the pure sum of the different propagation delays of the stages and registers. If one tried to choose an X value which is more negative than the ideal Tpd limits would allow, then this would lead to setup/hold timing violations at register flip-flop FF2.

In the device application, it is important to consider that the selected X value/selected PLL phase shift corresponds to a certain clock frequency $F_{clk}$. If the clock frequency changes, then also a new different X value/PLL phase shift has to be chosen for achieving a minimum propagation delay Tpd CLK->Qn.

An advantage of the block diagram/circuit topology is that a registered buffer with a PLL clock driver can be built which combines all seven of the listed functions/benefits together.

Such a registered buffer with a PLL clock driver that benefits from all these functions may be used for a future DDR3 (double data rate 3) memory system. There, the registered buffer may be placed on a DDR3 registered DIMM, together with the DDR3 SDRAM devices. The memory modules (DIMMs) containing the registered buffer/PLL device and several SDRAM devices will be controlled by a memory controller device.

An example DDR3 memory system is shown in FIG. 2. The address signals and the system clock coming from the memory controller are connected to every SDRAM device on every DIMM board. As the load for these signals would be too heavy and as therefore the signal quality and timing would degrade too much, a registered buffer with PLL clock driver is placed on each DIMM module in order to buffer the incoming address signals and to give the address signals out with a "refreshed" waveform. The PLL clock driver has the function to "refresh" the system clock signal too. The clock signal is cleaned from its clock jitter and applied to every SDRAM on the DIMM board.

Reviewing the particular application, it becomes clear that all the above described device functions are important for the system function:

1.) The registered buffer is able to handle a minimum setup/hold time between the addresses and the clock coming from the memory controller.

2.) It provides a jitter-cleaned clock signal for the SDRAMs. In addition, as this jitter-cleaned clock signal is used in the SDRAMs for the generation of the data strobe signals, this jitter cleaning is also important for the data strobe signal and for the data signal timing relationship. The data strobe signals coming from the SDRAM to the controller are used to latch in the data signal coming from the SDRAM at the controller.

3.) It provides a "refreshed" buffered address signal with a "refreshed" output clock signal. These "refreshed" two signals lead also to a "refreshed" setup/hold timing margin between the two signals at the SDRAMs.

4.) It maximizes the setup/hold timing margin between the buffered address signals and the clock signal for the SDRAM devices.

5.) It provides a temperature stable, very low phase variation between the register output clock and the register input clock.

This phase variation stability is very important for the entire system. After the power up of the entire system, the memory controller does a "learning phase" to evaluate the propagation time of the system clock and of the address/data signals, in order to find the best phase relationship between these signals and to use this evaluated phase relation for the normal operation mode.

Once the best phase relationship has been evaluated, it is used to set the right phase relationship between the data, address and clock signals for sending and receiving activities in the normal operation mode. Therefore, it is important that the evaluated phase relationship not change too much in the future due to temperature and environment changes.

6.) The registered buffer also provides a temperature stable relationship between the output address and the output clock signals. This leads to a maximum, temperature stable setup/hold timing margin between these signals for the subsequent receiving SDRAM devices.

7.) The registered buffer makes it possible to reduce the propagation delay for the address signals from the input to the output to a minimum. This propagation delay time determines how long it takes to provide the SDRAMs with the required address signals. The lower the propagation delay time is, the lower the system time will be to address the SDRAMs. Therefore, a minimum propagation delay time leads to a low access time of the memory system.

Figure 5:
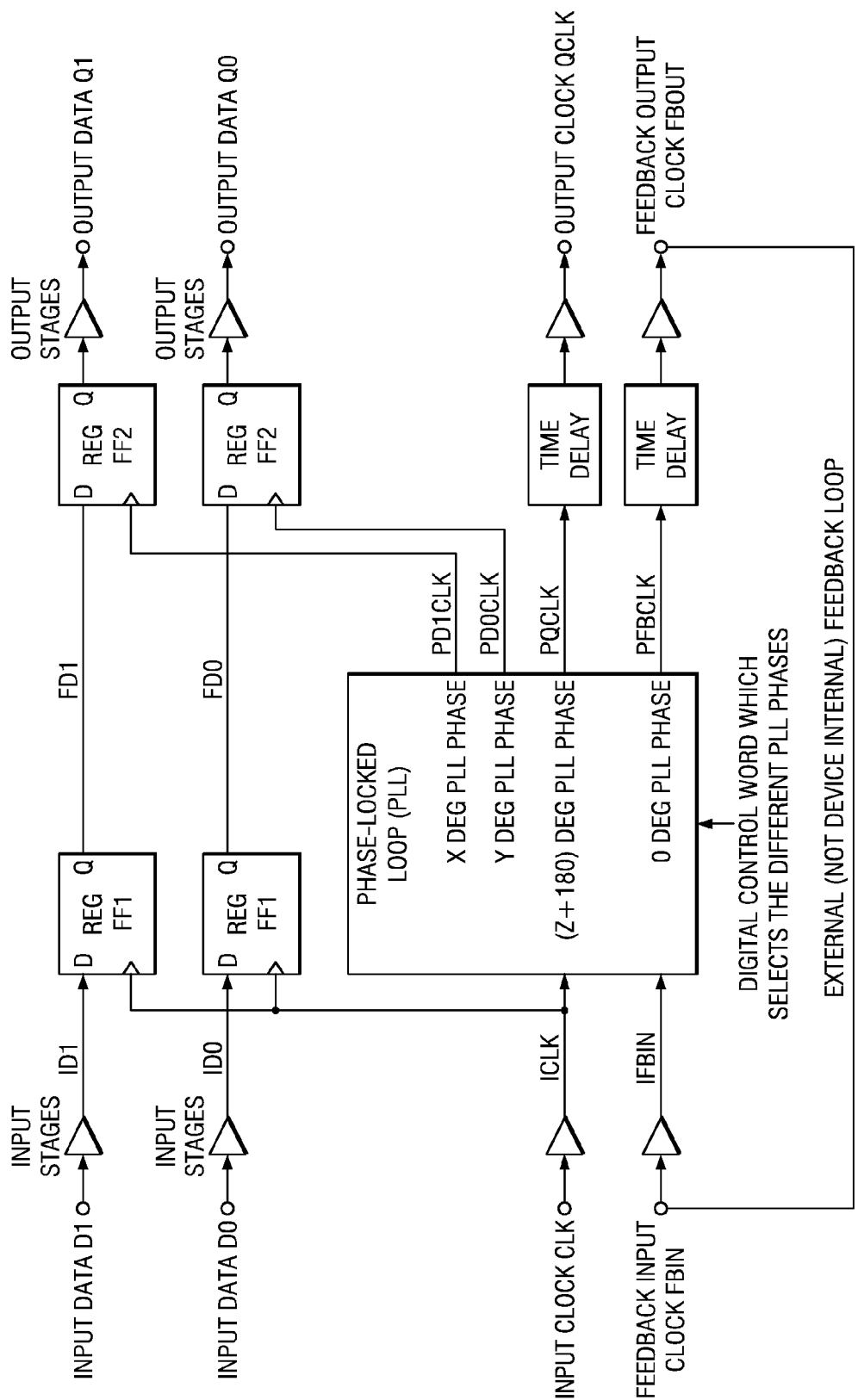
FIG. 5 a schematic block diagram of a registered digital data buffer according to a second embodiment.

FIG. 5 shows an embodiment that is generally similar to that of FIG. 1, but the PLL provides separate clock signals PD1CLK and PD2CLK to the second data register FF2 of two example data paths D0->Q0 and D1->Q1. Clock signal PD1 is shifted in phase by an amount X with respect to the internal feedback clock signal PFBCLK, and clock signal PD1 is shifted in phase by an amount Y. The phase shifts X and Y are typically different from each other. In addition, the clock output signal PQCLK is shifted by an amount of Z+180 deg. with respect to the internal feedback clock signal PFBCLK, Z being typically different from X and Y.

In FIG. 5, only two data paths D0->Q0 and D1->Q1 are shown, but it should be clear that more than two such data paths are typically provided, each with an appropriate output data timing.

This embodiment is an enhancement in that it implements a "pre-/post-launch" of different output signals. In addition, this can be done without a reduction of the setup/hold timing margin between the input clock CLK and the input data Qn at the device input. "Pre-/post-launch" of output signals means that, for example, some output data Qn are earlier or later at the device output compared to the other output data Qn. Depending on the reference point of view, "pre-launch" means that the signals come earlier and "post-launch" means that the signals come later than a reference signal group. The signal groups for "pre-/post-launch" can also include the output clock signals. The "pre-/post-launch" can be used to compensate different output line loads. If, for example, one output signal group sees a heavier load than the other signal group, then this first signal group would arrive later at the subsequent device than the second signal group. If it is desired to have an equal arrival time of the two signal groups at the subsequent devices, then the signal propagation time of the signals can be equalized by changing the board layout (use different line length or different capacitive load for the signal lines) or by doing a "pre-launch" or "post-launch" of one signal group on-chip. In this example, a "pre-launch" of the first output signal group or a "post-launch" of the second output signal group would lead to an equal arrival time at the subsequent devices.

The "pre-/post-launch" can be implemented in the block diagram by using two or more PLL output clock signals with different signal phases for triggering the register flip-flop FF2. The first PLL output clock signal is the PDCLK signal which triggers the register flip-flops FF2 of one signal group. The other PLL output clock signals are used to trigger the register flip-flops FF2 of the other "pre-/post-launch" output signals groups. The other PLL output clock signals have different signal phases compared to the PDCLK clock phase. The phase different determines the desired "pre-/post-launch" timing shift. An advantage of this embodiment is that this "pre-/post-launch" feature can be implemented without a reduction of the setup/hold timing margin between the input clock CLK and the input data Qn at the device input. As the shown implementation has a double buffer structure (two register flip-flops in series for one data path), only the second flip-flop FF2 is triggered by the PLL output clock signals which will have different clock phases depending on the desired "pre-/post-launch" timing shift. The first flip-flop FF1 still gets the ICLK signal from the clock input stage and therefore the input setup/hold timing margin has not changed.

An advantage of this embodiment is that a registered buffer with a PLL clock driver can be built which combines all the functions and benefits described above.

Those skilled in the art will appreciate that there are many other ways, besides the given examples, for implementing the claimed invention.

What is claimed is:

1. A memory system comprising a memory controller and at least one memory board, the memory board comprising a digital data buffer having at least one data path with a data input for receiving a digital data input signal, a clock input for receiving a clock input signal and a data output providing a digital data output signal for application to a data destination device, the buffer further having a clock output for providing an output clock signal to the data destination device and a phase-locked loop with a clock input, a feedback input, a feedback output and a plurality of clock outputs; wherein: the data path has a first data register with a data input, a clock input and a data output; the data path has a second data register with a data input, a clock input and a data output; the data input of the buffer is connected to the data input of the first data register; the data output of the first data register is connected to the data input of the second data register; the data output of the buffer is connected to the data output of the second data register; the clock input of the buffer is connected to the clock input of the the first data register; the clock input of the buffer is connected to the clock input of the phase-locked loop; a first clock output of the phase-locked loop provides a feedback clock signal for application to the feedback input of the phase-locked loop; a second clock output of the phase-locked loop provides a clock signal shifted in phase by a fraction of the clock period with respect to the feedback clock signal for application to the clock input of the second data register; and a third clock output of the phase-locked loop provides a clock signal shifted in phase by an amount of 180 deg. plus a fraction of the clock period with respect to the feedback clock signal for application to the clock input of the data destination device.

2. The digital data buffer of claim 1, wherein the fraction of the clock period is adjusted to optimize the propagation delay of data bits through the buffer as measured from an edge of the input clock signal to a corresponding edge of the output signal.

3. The digital data buffer of claim 1, wherein the fraction of the clock period is set to zero.

4. The digital data buffer of claim 1, wherein the fraction of the clock period is adjusted by applying a digital control word to the phase-locked loop.

5. The digital data buffer of claim 1, wherein the data input, the clock input and the feedback input each have an input stage that converts a differential input to a single-ended output.

6. The digital data buffer of claim 5, wherein the phase-locked loop has a feedback loop external to integrated circuitry of the phase-locked loop, the feedback input is matched with the clock input and the feedback output is matched with the clock output.

7. The digital data buffer of claim 6, wherein the data output is matched with the clock output, the clock output and the feedback output each including a delay element introducing a delay corresponding to the propagation delay of the second data register.

8. The digital data buffer of claim 1, wherein the data output, the clock output and the feedback output each have an output stage converting a single-ended input to a differential output.

9. The digital data buffer of claim 8, wherein the phase-locked loop has a feedback loop external to integrated circuitry of the phase-locked loop, the feedback input is matched with the clock input and the feedback output is matched with the clock output.

10. The digital data buffer of claim 9, wherein the data output is matched with the clock output, the clock output and the feedback output each including a delay element introducing a delay corresponding to the propagation delay of the second data register.

11. The digital data buffer of claim 1, wherein the digital input signal is n bits wide and the buffer comprises n similar data paths each with a first data register clocked by the clock input signal and a second data register clocked by the clock signal from the second clock output of the phase-locked loop.

12. The digital data buffer of claim 1, and comprising at least two of said data paths each with a first data register clocked by the clock input signal and a second data register, wherein the phase-locked loop has at least two clock outputs each providing a clock signal shifted in phase by a fraction of the clock period with reference to the feedback clock signal and the second data registers in said at least two data paths are clocked by different ones of said phase-shifted clock signals.

13. The digital data buffer according to claim 12, wherein the third clock output of the phase-locked loop provides a clock signal shifted in phase by an amount of 180 deg. plus a fraction of the clock period with respect to the feedback clock signal, said fraction being different from the fractions by which the clock signals applied to the second data registers are phase-shifted.

14. The digital data buffer according to claim 12, wherein the third clock output of the phase-locked loop provides a clock signal shifted in phase by an amount of 180 deg. plus a fraction of the clock period with respect to the feedback clock signal, said fraction being the same as one of the fractions by which the clock signals applied to the second data registers are phase-shifted.

* * * * *